(12) United States Patent
Naji

(10) Patent No.: US 6,445,612 B1
(45) Date of Patent: Sep. 3, 2002

(54) MRAM WITH MIDPOINT GENERATOR REFERENCE AND METHOD FOR READOUT

(75) Inventor: Peter K. Naji, Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/940,320

(22) Filed: Aug. 27, 2001

(51) Int. Cl.[7] .............................................. G11C 11/00
(52) U.S. Cl. ........................................ 365/158; 365/157
(58) Field of Search .................................. 365/158, 157

(56) References Cited

U.S. PATENT DOCUMENTS 6,055,178 A * 4/2000 Naji ............................ 365/158
6,191,972 B1 * 2/2001 Miura et al. ................. 365/158

* cited by examiner

Primary Examiner—Huan Hoang
(74) Attorney, Agent, or Firm—William E. Koch; Douglas W. Gilmore

(57) ABSTRACT

The MRAM architecture includes a data column of memory cells and a reference column, including a midpoint generator, positioned adjacent the data column on a substrate. The memory cells and the midpoint generator include similar magnetoresistive memory elements, e.g. MTJ elements. The MTJ elements of the generator are each set to one of Rmax and Rmin and connected together to provide a total resistance of a midpoint between Rmax and Rmin. A differential read-out circuit is coupled to the data column and to the reference column for differentially comparing a data voltage to a reference voltage.

28 Claims, 7 Drawing Sheets

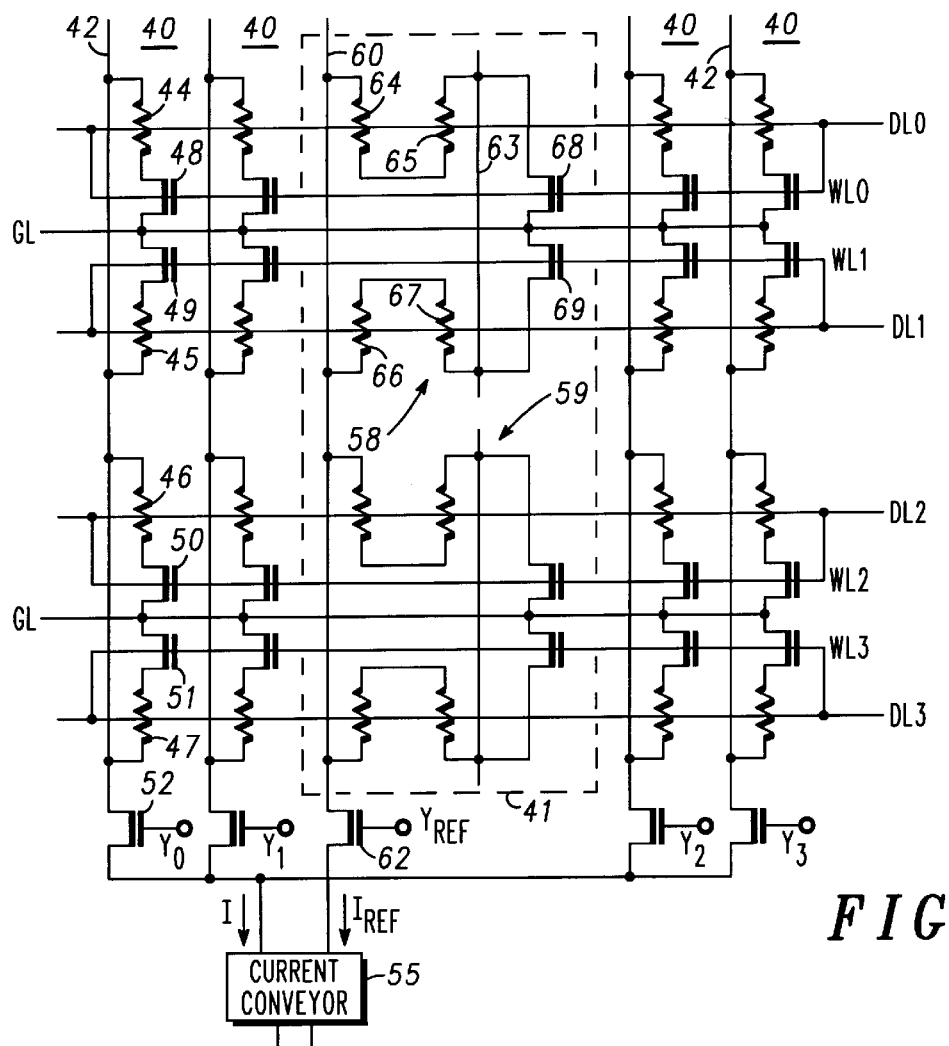
*FIG. 1*
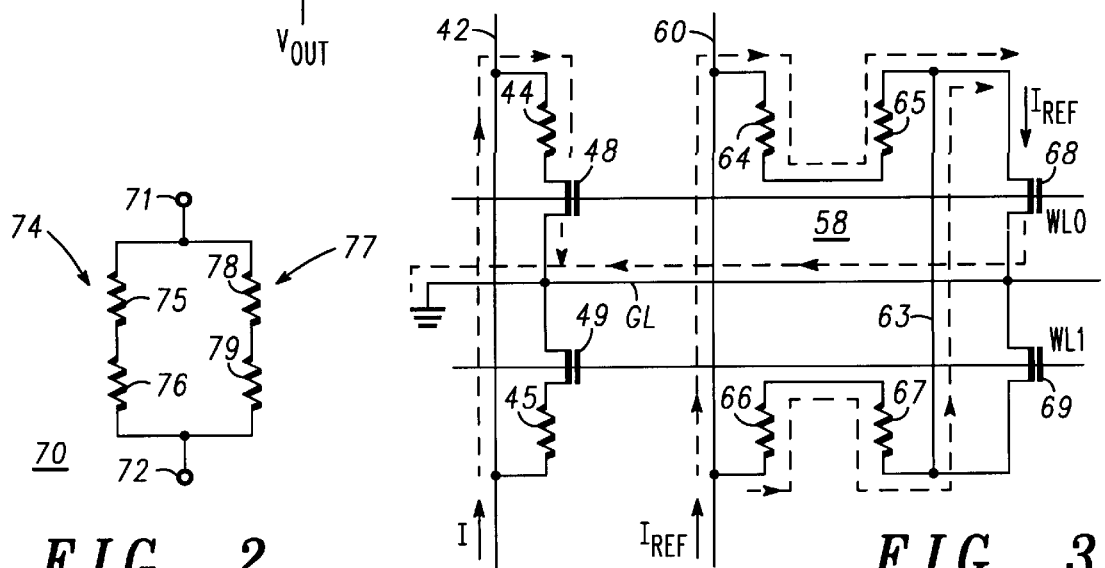
*FIG. 2*
*FIG. 3*

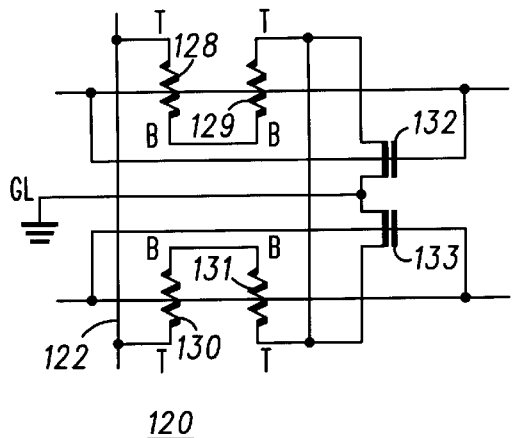
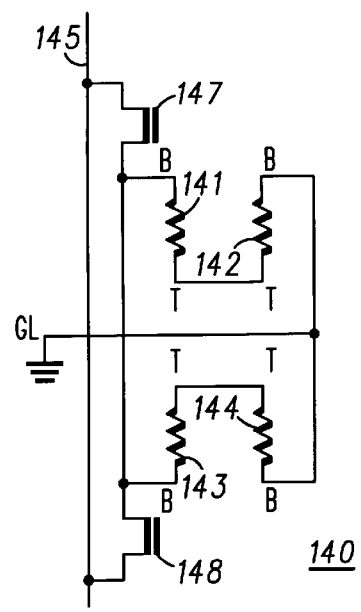
FIG. 6
FIG. 7
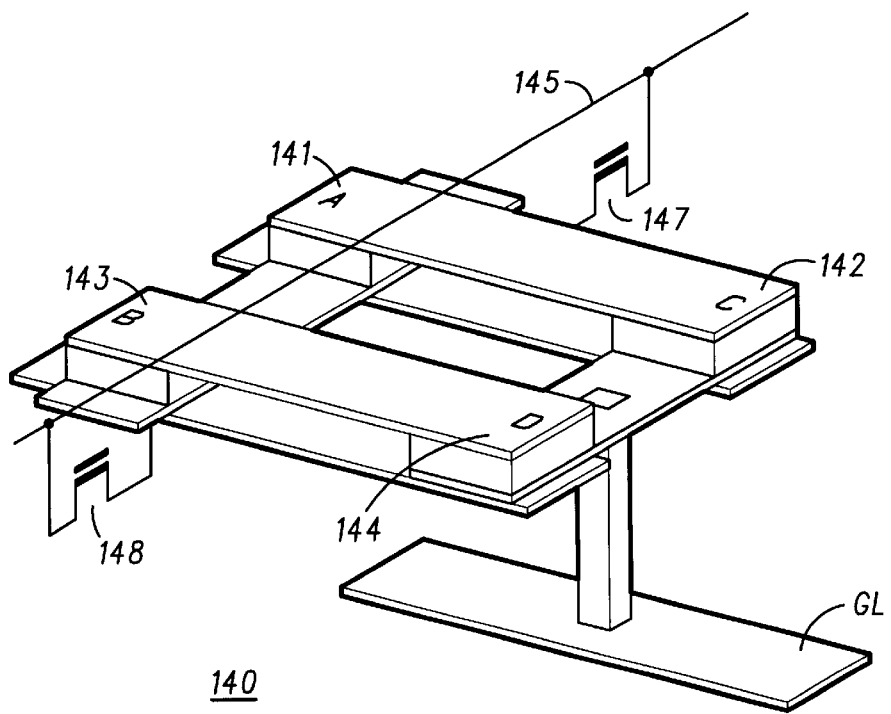
FIG. 8

MRAM WITH MIDPOINT GENERATOR REFERENCE AND METHOD FOR READOUT

FIELD OF THE INVENTION

This invention relates to magnetoresistive memories and more particularly, to apparatus and a method for reading data stored in magnetoresistive memories.

BACKGROUND OF THE INVENTION

Thin film Magnetoresistive Random Access Memories (MRAMs) can be fabricated in a variety of memory cell embodiments, including a Magnetic Tunneling Junction (MTJ) cell. Since the MTJ cell is the easiest to manufacture and use, it will be used as the primary example throughout this disclosure, with the understanding that the various concepts also apply to other MRAM cells and arrays. The MTJ cell essentially consists of a pair of magnetic layers with an insulating layer sandwiched therebetween. One of the magnetic layers has a fixed magnetic vector and the other magnetic layer has a changeable magnetic vector that is either aligned with or opposed to the fixed magnetic vector. When the magnetic vectors are aligned the resistance of the MTJ cell, i.e. the resistance to current flow between the magnetic layers, is a minimum and when the magnetic vectors are opposed or misaligned the resistance of the MTJ cell is a maximum.

Data is stored in the MTJ cell by applying a magnetic field to the MTJ cell directed so as to move the changeable magnetic vector to a selected orientation. Generally, the aligned orientation can be designated a logic 1 or 0 and the misaligned orientation is the opposite, i.e., a logic 0 or 1. Stored data is read or sensed by passing a current through the MTJ cell from one magnetic layer to the other. The amount of current passing through the MTJ cell, or the voltage drop across the MTJ cell, will vary according to the orientation of the changeable magnetic vector. Additional information as to the fabrication and operation of MTJ memory cells can be found in U.S. Pat. No. 5,702,831, entitled "Multi-Layer Magnetic Tunneling Junction Memory Cells", issued Mar. 31, 1998, and incorporated herein by reference.

In some prior art circuits, reading data stored in MTJ cells is achieved by passing a current through a series circuit including a load resistor and the MTJ cell. The current passing through the MTJ cell is controlled by a transistor with a bias voltage on the gate, and an output voltage is obtained at a junction between the load resistor and the current controlling transistor. Also, a bitline and a data line for the MTJ cell (and other MTJ cells in the array) are clamped at a desired voltage by the transistor. There are several major problems with this type of data readout including the fact that the load resistor must be much larger than the resistance of the MTJ cell, which makes operation at low supply voltages very difficult. Also, the operation of the circuit is dependent upon the clamping voltage provided by the transistor and the bias voltage. However, the clamping voltage is a function of the resistance of the MTJ cell, the bias voltage, and the load resistance, any or all of which can vary with a specific readout process, variations in the supply voltage, changes in temperature, changes in the resistance of the MTJ cell, etc. Also, the large load resistance and the other components in this prior art circuit require large chip areas preventing the fabrication of high density memory arrays. Also, the input impedance is high due to the presence of the load resistor.

Some of these problems were overcome in U.S. Pat. No. 6,205,073, entitled "Current Conveyor and Method for Readout of MTJ Memories". In the '073 patent reference, columns were interspersed or distributed throughout an MTJ array. Each reference column carries a "midpoint" current produced by clamping the reference column to a reference bias voltage such that current flowing through the reference column is at a point between minimum and maximum currents flowing through a target column. The task of generating the reference bias voltage is accomplished by two MTJs and some linear CMOS circuitry. Even though this approach is reliable, it could suffer from CMOS circuitry variations and an inability of MTJs in reference bias generators to closely track MTJs in target and reference columns, since the reference bias generator could be located elsewhere on a chip.

Accordingly it is highly desirable to provide apparatus and a method of generating midpoints (e.g. resistance, current, and/or voltage) for reading or sensing MTJ memory cells which overcomes these problems.

BRIEF DESCRIPTION OF THE DRAWINGS

Referring to the drawings:

FIG. 1 is a simplified schematic diagram of a readout circuit with a reference column, including magnetoresistive midpoint generator cells, embedded in a single data block in accordance with the present invention;

FIG. 2 is a simplified schematic diagram illustrating the operation of a midpoint generator;

FIG. 3 is a schematic diagram of data memory cells in conjunction with a midpoint generator cell, illustrating current flow during a readout operation;

FIG. 6 is a simplified schematic diagram of one embodiment of a midpoint generator cell;

FIG. 7 is a simplified schematic diagram of another embodiment of a midpoint generator cell;

FIG. 8 is a simplified isometric view of the midpoint generator cell of FIG. 7;

DESCRIPTION OF THE PREFERRED EMBODIMENTS

Figure 4:
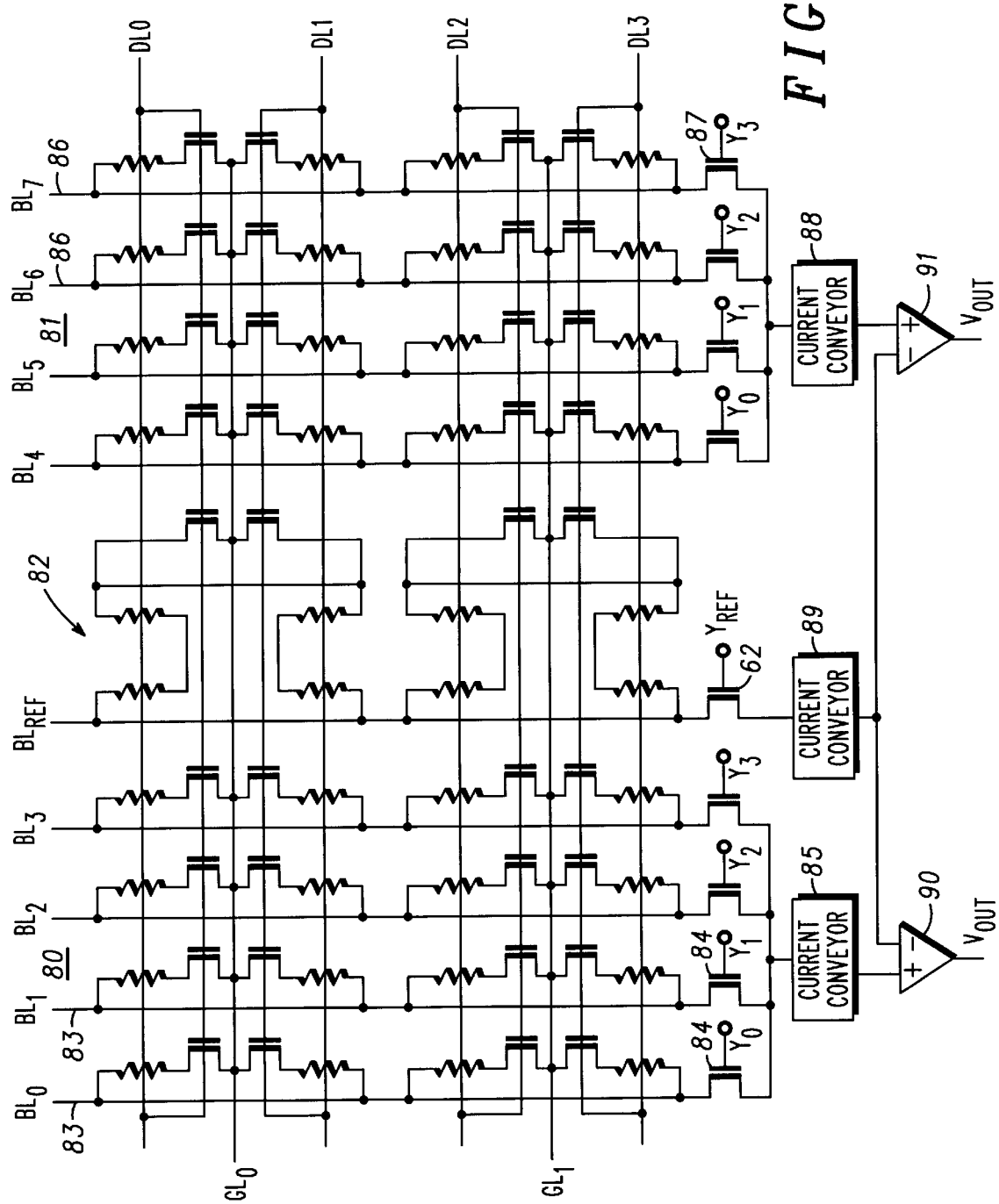
FIG. 4 is a simplified schematic diagram of a readout circuit with a reference column, including magnetoresistive midpoint generator cells, positioned between multiple data blocks in accordance with the present invention.

Turning now to FIG. 1, a simplified schematic diagram is illustrated of a readout circuit and reference column including magnetoresistive midpoint generators in accordance with the present invention. In this specific embodiment, a reference column 41 is embedded in a plurality of data columns, each designated 40, forming a single data block. Each data column 40 includes a bitline 42 having pairs of non-volatile magnetoresistive memory elements 44 and 45, and 46 and 47 connected thereto by means of control or activating transistors 48 through 51, respectively. In this preferred embodiment elements 44 through 47 are magnetic tunneling junction memory cells represented as resistances. Each element 44 through 47 is programmable to one of an Rmax and an Rmin state, in a manner well known in the art, so as to operate as a memory to store information. Bitline 42 is connected through a column select transistor (or switch) 52 to one input of a read-out circuit, which generally includes a current conveyor circuit 55, the outputs of which are connected to a differential amplifier.

Current conveyor circuit 55 includes individual components that preferably have a very low input impedance, isolating bitlines 42 from any high output impedance of current sources. The low input impedance combined with the clamping of bitlines 42 to $V_{bias}$ limits the voltage swing of bitlines 42 to achieve high speed readout for very high density MTJ arrays. In this preferred embodiment, current conveyor circuit 55 provides and maintains a constant bias across bitlines 42 regardless of operating temperatures, changes in the supply voltage, and process conditions. Also, current conveyor circuit 55 provides a small swing in the voltage on bitlines 42 to allow for high speed operation. Additional information on the operation, construction, and different embodiments of some current conveyors which may be utilized in current conveyor circuit 55 is available in U.S. Pat. No. 6,205,073, entitled "Current Conveyor and Method for Readout of MTJ Memories", incorporated herein by reference. It will of course be understood that any current conveyor circuit that performs the functions of the present invention can be used. Also, it will be understood that the term "current conveyor" is intended to include any other device that performs the described functions. e.g., current sensors, current sense amplifiers, pre-amplifiers, etc.

Reference column 41 includes two midpoint generator cells 58 and 59 coupled to a reference bitline 60. Reference bitline 60 is connected through a column select transistor (or switch) 62 to a second input of current conveyor circuit 55. Midpoint generator cell 58 includes a plurality of non-volatile magnetoresistive elements 64 through 67 each having an Rmax state and an Rmin state and each being set to one of Rmax and Rmin. In this embodiment, magnetoresistive elements 64 and 66 are set to Rmax and magnetoresistive elements 65 and 67 are set to Rmin. Further, magnetoresistive elements 64 and 65 are connected in a first series circuit between the input terminal (bitline 60) and the output terminal (line 63) of cell 58 and magnetoresistive elements 66 and 67 are connected in a second series circuit between the input terminal (bitline 60) and the output terminal (line 63) of cell 58. Magnetoresistive elements 64 through 67 are connected together to provide a total resistance of a midpoint resistance between Rmax and Rmin. Similarly, midpoint generator cell 59 includes a plurality (in this embodiment four) of non-volatile magnetoresistive elements connected together to provide a total resistance of a midpoint resistance between Rmax and Rmin. Two control transistors 68 and 69 are connected to direct current flow through cell 58, as will be described presently.

Referring additionally to FIG. 2, a simplified schematic diagram is provided to illustrate the operation of a midpoint generator 70. A midpoint resistance midway, or half way, between Rmin and Rmax is designated Rmid. The following equation describes the relationship of Rmid to Rmin and Rmax:

$$Rmid=(Rmax-Rmin)/2+Rmin$$

$$Rmid=\Delta R/2+Rmin \quad (1)$$

where $\Delta R=Rmax-Rmin$

Equation (1) is implemented by a series/parallel combination of magnetoresistive elements as illustrated in FIG. 2. Magnetoresistive elements can be combined in this manner because they are linear elements to the first order and, therefore, they can be treated as ordinary passive linear resistors. In this simplified example, midpoint generator 70 includes an input terminal 71 and an output terminal 72. A series circuit 74 includes a magnetoresistive element 75, with a resistance equal to Rmax, connected in series with a magnetoresistive element 76, with a resistance equal to Rmin, connected in series between input terminal 71 and output terminal 72. Another series circuit 77 includes a magnetoresistive element 78, with a resistance equal to Rmax, connected in series with a magnetoresistive element 79, with a resistance equal to Rmin, connected in series between input terminal 71 and output terminal 72. Series circuit 74 is also connected in parallel with series circuit 77 to form the series/parallel combination.

The series/parallel combination of resistances of generator 70 are combined as follows:

$$Rmid=(Rmax+Rmin)\|(Rmax+Rmin)=R_{AB}$$

where $R_{AB}$ is the total resistance between input terminal 71 and output terminal 72.

$$R_{AB}=(Rmax+Rmin)^2/2(Rmax+Rmin)=(Rmax+Rmin)/2=(\Delta R+Rmin+Rmin)/2 \; R_{AB}=\Delta R/2+Rmin \quad (2)$$

It can be seen that equation (2) is equal to equation (1), i.e. $R_{AB}$ is equal to Rmid, and generator 70 successfully generates the midpoint Rmid.

In general, magnetoresistive elements are non-volatile memory elements which can be programmed into an Rmax or an Rmin state, where Rmin is a minimum resistive value corresponding to parallel states of magnetization and Rmax is a maximum resistive value corresponding to anti-parallel states of magnetization. Further, magnetoresistive elements are generally initially in the Rmin state and must be programmed into the Rmax state prior to the generation of Rmid. This programming can be done as a one time effort and, thereafter, Rmax is generated automatically without any need to reprogram, since the magnetoresistive elements hold their magnetization state in a non volatile fashion.

Referring additionally to FIG. 3, a schematic diagram is illustrated of pair of data memory cells (one cell including magnetoresistive element 44 and control transistor 48 and another cell including magnetoresistive element 45 and control transistor 49) in conjunction with midpoint generator cell 58, to show current flow during a readout operation. In the read operation for the first memory cell (magnetoresistive element 44 and control transistor 48), wordline $WL_0$ is raised to a logic one while wordline $WL_1$ remains at a logic zero. The logic one on $WL_0$ causes control transistor 48 to conduct so that data current I in bitline 42 flows through magnetoresistive element 44 and control transistor 48 to a return or ground line GL.

Simultaneously, a control transistor 68, connected between magnetoresistive element 65 of midpoint generator cell 58 and ground line GL, is turned on by the logic one on $WL_0$, while a second control transistor 69, connected between magnetoresistive element 67 of midpoint generator cell 58 and ground line GL, remains off because of the logic zero on $WL_1$. Reference current ($I_{ref}$) flowing in reference bitline 60 splits at midpoint generator cell 58 with one half of the current flowing through magnetoresistive elements 66 and 67 and the other half of the current flowing through magnetoresistive elements 64 and 65. A direct connection is provided between magnetoresistive elements 65 and 67, so that the one half of the current flowing through magnetoresistive elements 66 and 67 flows through the direct connection to the upper terminal of control transistor 68 where it combines with the one half of the current flowing through magnetoresistive elements 64 and 65. The full reference current ($I_{ref}$) then flows through control transistor 68 to ground line GL. It will be seen that a similar current flow (but in an opposite direction through the direct connection) will occur when a logic one is applied to read the information stored in the other memory cell (magnetoresistive element 45 and control transistor 49). Thus, reference current ($I_{ref}$) flows in midpoint generator cell 58 to generate a midpoint voltage $V_{dataref}$ to act as a reference voltage for all types of sense amplifiers, e.g., for use in current conveyor 55 to produce $V_{ref}$.

Referring additionally to FIG. 4, a simplified schematic diagram is illustrated of a readout circuit with a reference column, including magnetoresistive midpoint generator cells, positioned between multiple data blocks in accordance with the present invention. The circuit of FIG. 4 includes a data block 80 and a data block 81 with a reference column 82 positioned between. Data blocks 80 and 81 are similar and are illustrated in this simplified form as a 4 bit by 4 bit block but it will be understood that any convenient size might be utilized. As described in conjunction with the embodiment of FIG. 1, data block 80 includes four bitlines 83 each connected through a column select transistor 84 to a current conveyor circuit 85. Similarly, data block 81 includes four bitlines 86 each connected through a column select transistor 87 to a current conveyor circuit 88. Reference column 82 is similar to reference column 41 of FIG. 1 and operates in a similar fashion. One difference in this embodiment is that reference column 82 supplies a reference signal to its own current conveyor circuit 89. The output signals of current conveyor circuits 85 and 89 are compared in a comparator 90 to supply an output signal from data block 80. The output signals of current conveyor circuits 88 and 89 are compared in a comparator 91 to supply an output signal from data block 81. Thus, a single reference column incorporating one or more midpoint generator cells can be used in conjunction with a plurality of data blocks or, as described in conjunction with FIG. 1, a reference column can be embedded in each data block.

Figure 5:
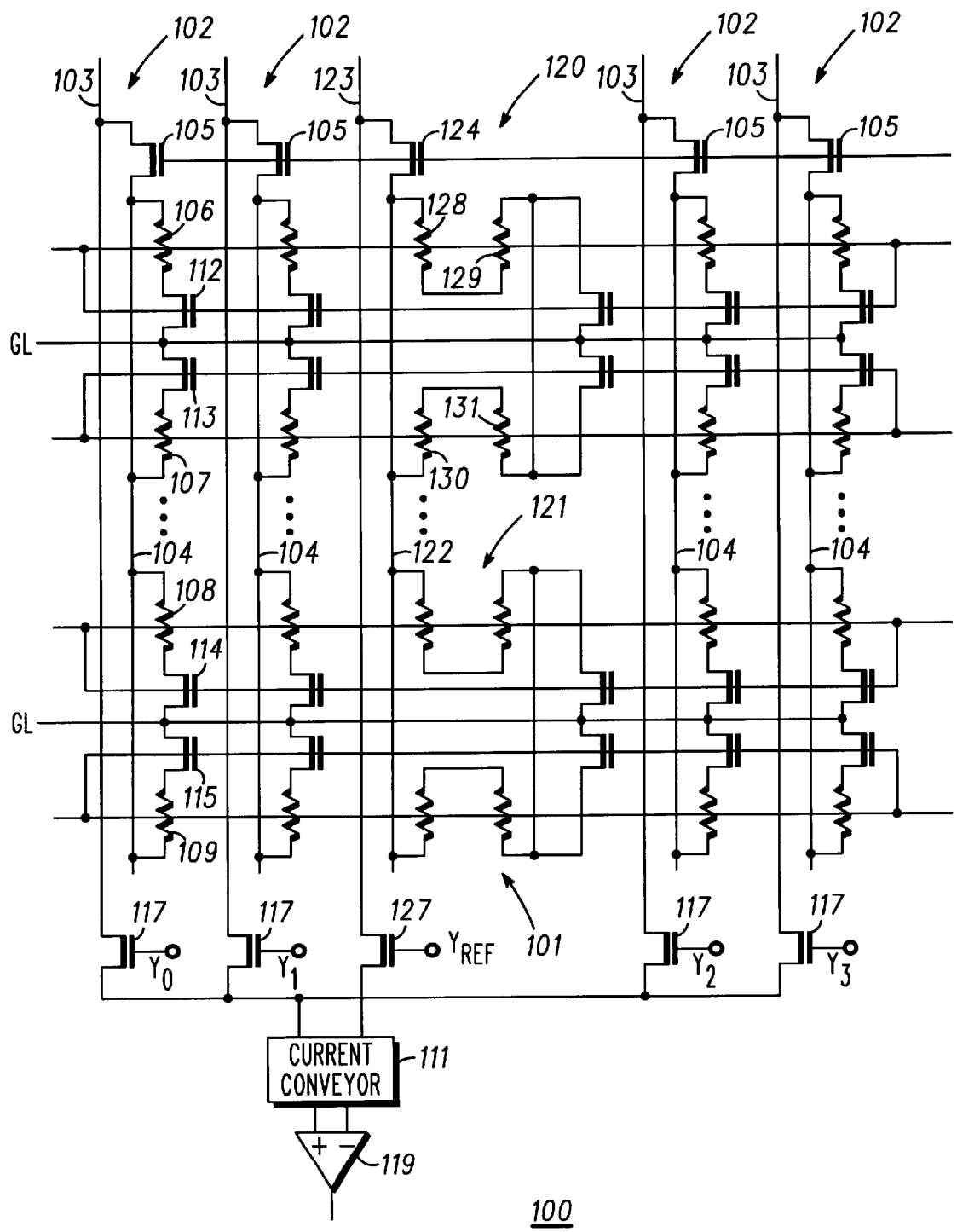
FIG. 5 is a simplified schematic diagram of an embodiment of an MRAM array in a parallel-parallel architecture with midpoint generator cells embedded in a single data block in accordance with the present invention.

Turning now to FIG. 5, another embodiment is illustrated of magnetoresistive random access memory architecture incorporating interspersed midpoint generators in accordance with the present invention. The memory architecture illustrated in FIG. 5 is referred to as parallel-parallel memory architecture and this memory is generally designated 100. Memory 100 includes a reference column 101 embedded in a plurality of data columns, each designated 102, forming a single data block. Each data column 102 includes a global bitline 103 and a local bitline 104, with local bitlines 104 being connected to associated global bitlines 103 by a segment select transistor 105. Non-volatile magnetoresistive memory elements 106, 107, 108 and 109 each have one side connected to an associated local bitline 104 with the other side being connected to a ground line GL by means of control or activating transistors 112 through 115, respectively.

In this preferred embodiment elements 106 through 109 are magnetic tunneling junction memory cells represented as resistances. Each element 106 through 109 is programmable to one of an Rmax and an Rmin state, in a manner well known in the art, so as to operate as a memory to store information. Each global bitline 102 is connected through a column select transistor (or switch) 117 to one input of a current conveyor circuit 118, the outputs of which are connected to a differential amplifier 119. Additional information and embodiments of parallel-parallel architecture are disclosed in a copending United States Patent Application entitled "MTJ MRAM Parallel-Parallel Architecture", Ser. No. 09/649,562, filed Aug. 28, 2000, assigned to the same assignee, and incorporated herein by reference.

Reference column 101 includes two midpoint generator cells 120 and 121 coupled to a local reference bitline 122. Also, local bitline 122 is coupled to a global reference bitline 123 by means of a segment select transistor 124. Global reference bitline 123 is connected through a column select transistor (or switch) 127 to a second input of current conveyor circuit 118. In this embodiment, midpoint generator cell 120 includes a plurality of non-volatile magnetoresistive elements 128 through 131 each having an Rmax state and an Rmin state and each being set to one of Rmax and Rmin. Magnetoresistive elements 128 through 131 are connected together to provide a total resistance of a midpoint resistance between Rmax and Rmin, generally as described with relation to FIG. 1. Similarly, midpoint generator cell 121 includes a plurality (in this embodiment four) of non-volatile magnetoresistive elements connected together to provide a total resistance of a midpoint resistance between Rmax and Rmin.

Referring additionally to FIG. 6, midpoint generator cell 120 is illustrated individually to better explain the modifications in following circuits. Further, in the actual construction, magnetoresistive elements 128 through 131 are generally fabricated as stacks or stacked layers of material positioned on a supporting surface (e.g., a semiconductor substrate or the like). In FIG. 6 the bottom of each stack forming a magnetoresistive element is designated with a B and the top of the stack is designated with a T. Here it can be noted that a pair of control transistors 132 and 133 are incorporated to control the direction of current flow through midpoint generator cell 120 in accordance with the associated data cell being read (see FIG. 3 for a complete explanation). Control transistors are normally formed in the semiconductor substrate, but in this embodiment one current terminal of each control transistor 132 and 133 is connected to the top layer of magnetoresistive elements 128 and 129, respectively.

To reduce the connections and components in the midpoint generator cell illustrated in FIG. 6, another embodiment illustrated in FIG. 7 can be used. The midpoint generator cell, generally designated 140, includes four magnetoresistive elements 141 through 144, with the top and bottom of the stacks being designated B and T. In this embodiment, the bottoms of elements 141 and 143 are connected together and the bottoms of elements 142 and 144 are connected together. Also the tops of elements 141 and 142 are connected together and the tops of elements 143 and 144 are connected together. A simplified isometric view generally illustrating the physical positioning of magnetoresistive elements 141 through 144 is illustrated in FIG. 8. It can be readily seen that the interconnections and, thus, the fabrication of magnetoresistive elements 141 through 144 is greatly simplified by this arrangement.

The bottom of elements 142 and 144 are connected to a ground line GL. The bottom of element 141 is connected to a local bitline 145 through a control transistor 147 and the bottom of element 143 is connected to local bitline 145 through a control transistor 148. Since the control transistors are normally formed in the semiconductor substrate (at the bottoms of the stacks), this connection is very simple to incorporate into the actual structure. Further, it can be seen that when either control transistor 147 or control transistor 148 is activated magnetoresistive elements 141 through 144 form the parallel circuits previously described to generate the desired midpoint at local bitline 145.

Figure 9:
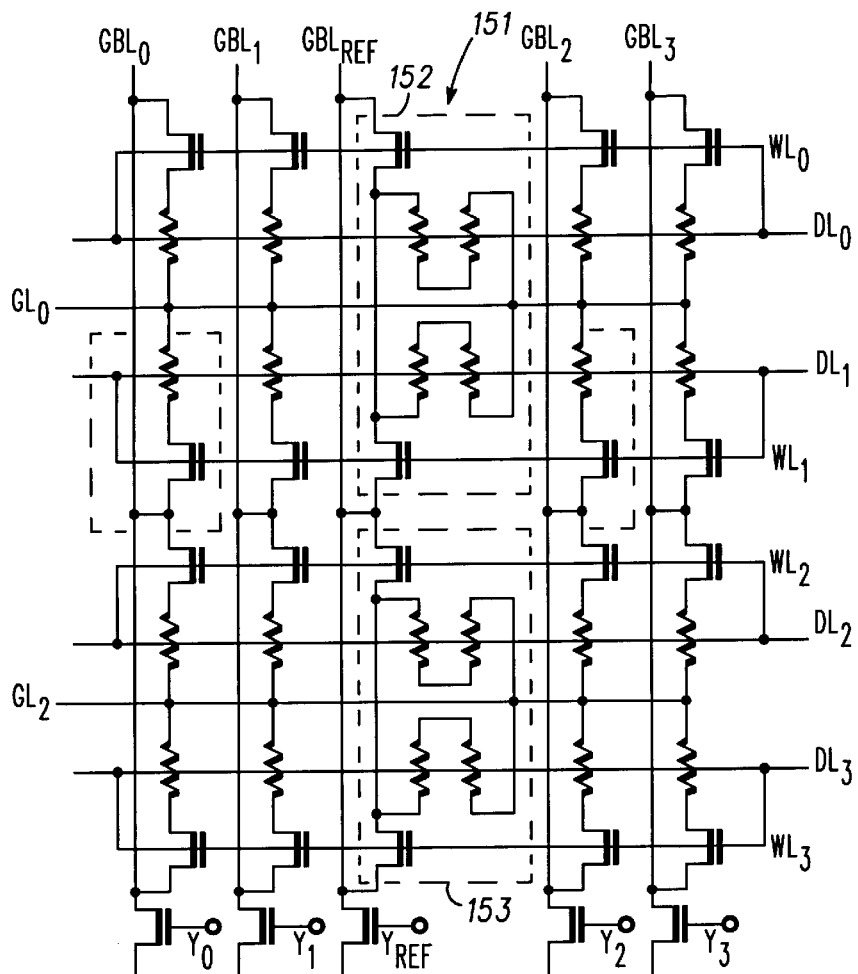
FIG. 9 is a simplified schematic diagram of an embodiment of an MRAM array in a parallel-parallel architecture without segment select transistors and with midpoint generator cells embedded in a single data block in accordance with the present invention.
Figure 10:
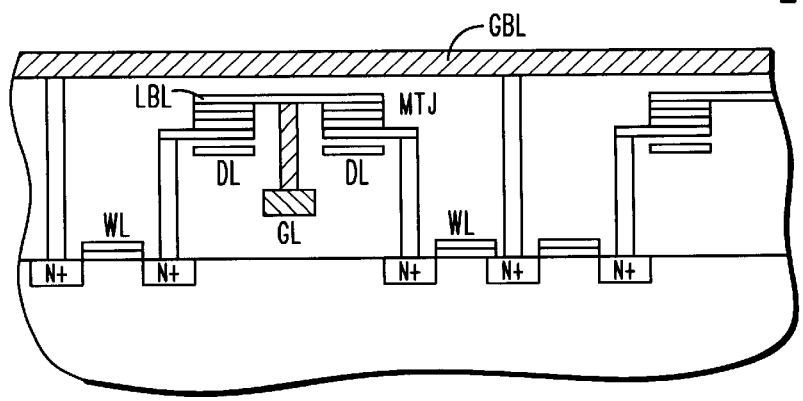
FIG. 10 is a simplified cross-sectional view of a column of data cells in the architecture of FIG. 9

Referring additionally to FIG. 9, a simplified schematic diagram is illustrated of a parallel-parallel memory 150. Memory 150 is generally similar to memory 100 of FIG. 5, except that the segment select transistors 105 have been eliminated, with the consequent elimination of separate local bitlines 104, and the connection of control transistors 112 between global bitlines and MTJ memory cells. Also, a reference column 151 includes two midpoint generator cells 152 and 153, each of which is similar to midpoint generator cell 140 of FIG. 7. Here it can be seen that the magnetoresistive elements and the control transistors are positioned in a regular pattern so that the fabrication of this embodiment is greatly simplified. Referring additionally to FIG. 10, a simplified sectional view illustrates the physical positioning of data magnetoresistive elements and control transistors in a column of data elements with the segment select transistor eliminated. The elimination of the segment select transistors in this architecture saves memory area and the delay through the segment select transistors. However, the junction capacitance of all control or isolation transistors is added, which will result in some speed degradation.

Relative to the regular pattern of the components, it should be noted that any specific data element is selected by activating the associated global bitline ($GBL_0$ through $GBL_3$) and the associated digitline ($DL_0$ through $DL_3$). When the upper data element in any of the four data columns is selected by activating the appropriate global bitline and digitline $DL_0$, the upper control transistor in midpoint generator cell 152 is also activated. Thus by activating the global reference bitline $GBL_{ref}$, the appropriate reference signal is generated in midpoint generator cell 152 and applied to global reference bitline $GBL_{ref}$ and through the current conveyor to the comparator. The specific midpoint generator cell utilized is always positioned adjacent the data cell being read so that there is a minimum, or no, difference in construction and ambient factors (e.g. temperature, etc.,) between the data cell being read and the midpoint generator cell.

Figure 11:
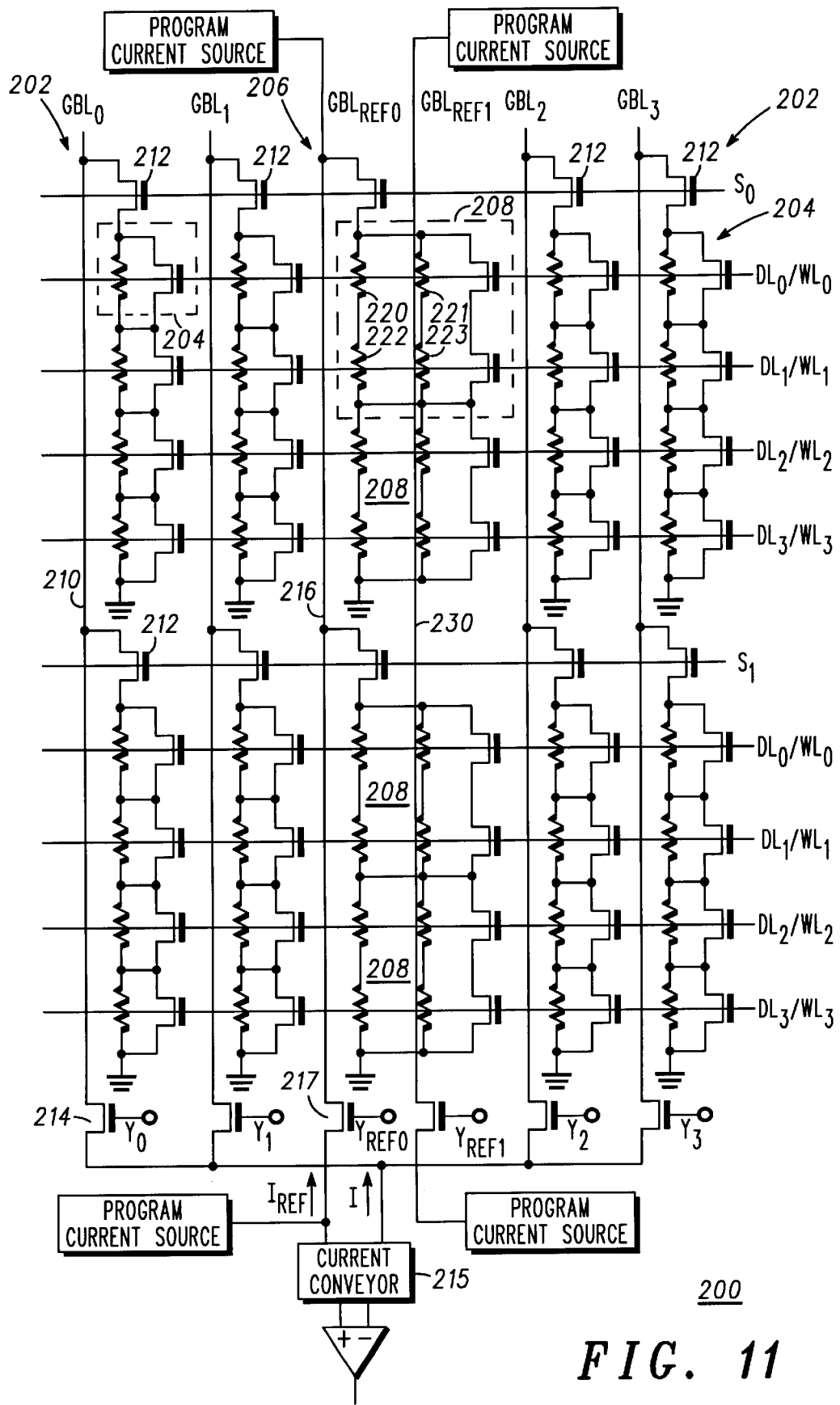
FIG. 11 is a simplified schematic diagram of an embodiment of an MRAM array in a series-parallel architecture with an embedded reference lines including midpoint generator cells in accordance with the present invention.
Figure 12:
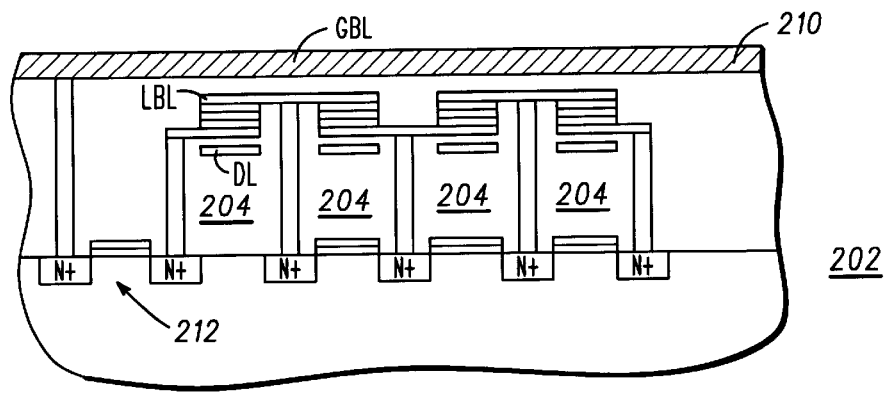
FIG. 12 is a simplified cross-sectional view of a column of data cells in the architecture of FIG. 11.

Turning now to FIG. 11, a simplified schematic diagram is illustrated of an embodiment of an MRAM array 200 in a series-parallel architecture. Array 200 includes a plurality (four in this embodiment) of columns 202 of data cells 204 and an embedded reference column 206 including midpoint generator cells 208 in accordance with the present invention. Each data cell 204 includes a magnetoresistive element connected in parallel with a control transistor. Here it should be noted that the control transistor is normally conducting to short-out or remove the magnetoresistive element from the circuit. To read a data cell the control transistor is made nonconductive. Each data column 202 includes a plurality of series segments each including a plurality of series connected data cells 204. Each series segment is connected to a global bitline 210 by a segment select transistor 212 so that all series segments in a column are connected in parallel. Each global bitline 210 of columns 202 is connected through a column select transistor 214 to one input of a current conveyor 215. Referring additionally to FIG. 12, a simplified cross-sectional view of a series segment of one data column 202 is illustrated. Additional information and embodiments of series-parallel architecture are disclosed in a copending United States Patent Application entitled "MTJ MRAM Series-Parallel Architecture", Ser. No. 09/649,117, filed Aug. 28, 2000, assigned to the same assignee, and incorporated herein by reference.

Figure 13:
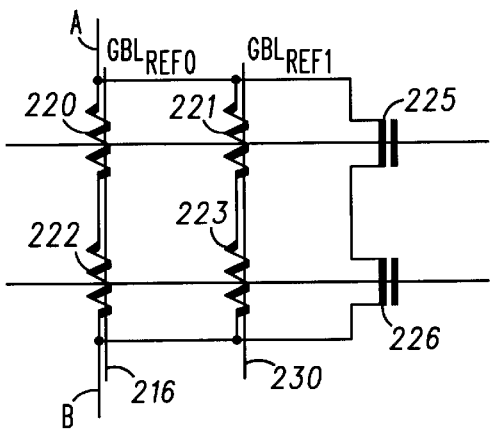
FIG. 13 is a simplified schematic diagram of another embodiment of a midpoint generator cell.
Figure 14:
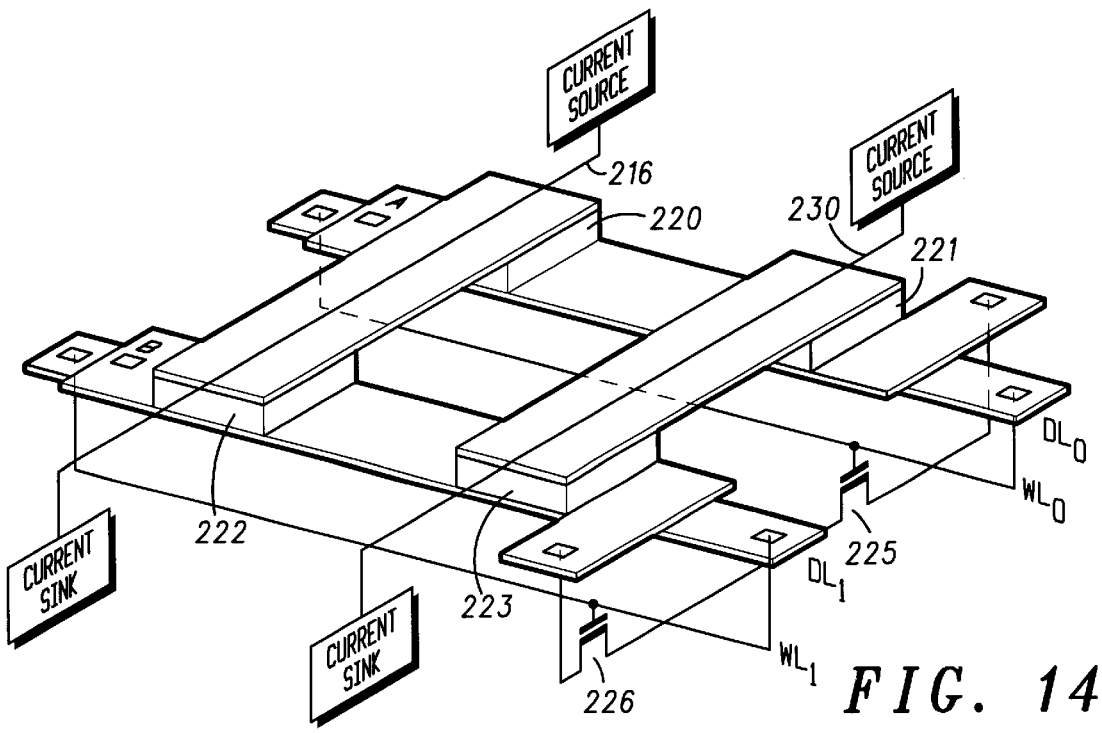
FIG. 14 is a simplified isometric view of the midpoint generator cell of FIG. 13.

Reference column 206 includes a plurality of series segments of midpoint generator cells 208 coupled to a reference bitline 216. Reference bitline 216 is connected through a column select transistor (or switch) 217 to a second input of current conveyor circuit 215. Each midpoint generator cell 208 includes a plurality of non-volatile magnetoresistive elements 220 through 223 each having an Rmax state and an Rmin state and each being set to one of Rmax and Rmin. Referring additionally to FIG. 13, a single midpoint generator cell 208 is illustrated for a better understanding of the operation. In addition to magnetoresistive elements 220 through 223, each midpoint generator cell 208 includes a pair of control transistors 225 and 226 connected in series across the series connected magnetoresistive elements 221 and 223. Thus, each midpoint generator cell 208 includes magnetoresistive elements 220 and 222 connected in series between I/O terminals A and B, magnetoresistive elements 221 and 223 connected in series between I/O terminals A and B, and control transistors 225 and 226 connected in series between I/O terminals A and B. A simplified isometric view of the single midpoint generator cell 208 of FIG. 13 is illustrated in FIG. 14.

In the programming of each midpoint generator cell 208, programming current is supplied to magnetoresistive elements 220 and 222 by means of global bitline 216 and to magnetoresistive elements 221 and 223 by means of a second global bitline 230. Additional programming and selection or addressing is provided by means of digitlines $DL_0$ or $DL_1$. Here it should be noted that each data cell in each series segment in array 200 can be addressed individually by means of the global bitlines and digitlines $DL_0$ through $DL_3$. In each midpoint generator cell 208, magnetoresistive elements 220 and 221 are programmed to an Rmax state and magnetoresistive elements 222 and 223 are programmed to (or remain in) an $R_{min}$ state. The resultant resistance between terminals A and B is $R_{AB}=\Delta R/2+Rmin$.

In operation, control transistors 225 and 226 are normally conducting so that midpoint generator cell 208 (referring to FIG. 13) is normally disconnected, or has no effect, on the array. When a data cell in either the row of array 200 including magnetoresistive elements 220 and 221 or the row including magnetoresistive elements 222 and 223 is selected by means of activating either digitline $DL_0$ or digitline $DL_1$, control transistor 225 or 226, respectively, is shut-off. When either of the control transistors 225 or 226 is nonconducting, midpoint generator cell 208 (referring to FIG. 13) is in the circuit and supplies a reference signal on global bitline 216 to current conveyor 215.

In all of the above embodiments, it should be understood that a plurality of data columns are or can be associated with a single reference column and reference columns can be interspersed, embedded, or distributed throughout an array of data columns. For example, in the structure illustrated in FIG. 1 the reference column could include midpoint generators and the data columns on either side could be expanded to 4, 8, etc. The number of reference columns included can be fewer where a limited number of reference columns are distributed throughout an array consisting of 8, 16, 32, or 64 data blocks.

Generally, the reference column or columns in the MRAM architecture are made up of n/2 midpoint generator cells, where n is the number of memory cells in each data column. Also, the midpoint generator placement in each reference column is such that each midpoint generator occupies the area taken by four magnetoresistive elements. That is, generally a memory is fabricated on a single substrate (e.g. a semiconductor chip or the like) and the magnetoresistive elements are positioned in rows and columns in a regular pattern. Further, the magnetoresistive elements of the plurality of data columns and the magnetoresistive elements of the plurality of reference columns are generally similar. A very important aspect of the reference column including midpoint generators is that it is capacitively very close to the adjacent data columns. As a result, all time varying signals in the data and reference columns track very closely, resulting in high speed read processing.

Thus, new and improved MRAM architectures are disclosed and described which greatly improve the operation and reliability of magnetoresistive element readout circuits. Because of the new and improved reference columns with midpoint generators, circuit operation is faster and more reliable. Because of the new and improved reference columns with midpoint generators, read access is super fast and the architecture is very robust and reliable generally at least matching that of SRAM performance.

While I have shown and described specific embodiments of the present invention, further modifications and improvements will occur to those skilled in the art. I desire it to be understood, therefore, that this invention is not limited to the particular forms shown and I intend in the appended claims to cover all modifications that do not depart from the spirit and scope of this invention.

What is claimed is:

1. Magnetoresistive random access memory architecture comprising:

at least one data column of memory cells connected to have information stored therein, each memory cell including at least one non-volatile magnotoresistive element programmable to one of a data-Rmax and a data-Rmin state, wherein each memory cell of said data column of memory cells includes a magnetic tunnel junction and a control transistor; and at least one reference column including at least one midpoint generator cell positioned adjacent the data column, the midpoint generator cell including at least a plurality of non-volatile magnetoresistive elements each being set to at least one of reference-Rmax and reference-Rmin and the plurality of non-volatile magnetoresistive elements being connected together to provide a total resistance corresponding to a midpoint resistance between said reference-Rmax and reference-Rmin.

2. Magnetoresistive random access memory architecture as claimed in claim 1 wherein each memory cell includes a magnetic tunnel junction and a control transistor connected in series.

3. Magnetoresistive random access memory architecture as claimed in claim 1 wherein each memory cell includes a magnetic tunnel junction and a control transistor connected in parallel.

4. Magnetoresistive random access memory architecture as claimed in claim 1 wherein the data column includes a plurality of pairs of memory cells and the reference column includes a midpoint generator operatively and physically associated with each pair of memory cells.

5. Magnetoresistive random access memory architecture as claimed in claim 1 further including a plurality of data columns of memory cells and a plurality of reference columns each including a midpoint generator cell interspersed with the plurality of data columns, the magnetoresistive elements of the plurality of data columns and the magnetoresistive elements of the plurality of reference columns being similar and being positioned on a substrate in a regular pattern.

6. Magnetoresistive random access memory architecture as claimed in claim 1 wherein the midpoint generator cell included in the reference column further includes an input terminal and an output terminal, a first series circuit including a first magnetoresistive element with a resistance equal to Rmax connected in series with a first magnetoresistive element with a resistance equal to Rmin, the first series circuit connected in series between the input terminal and the output terminal, and a second series circuit including a second magnetoresistive element with a resistance equal to Rmax connected in series with a second magnetoresistive element with a resistance equal to Rmin, the second series circuit connected in series between the input terminal and the output terminal and in parallel with the first series circuit, whereby a total resistance between the input terminal and the output terminal is a midpoint between Rmax and Rmin.

7. Magnetoresistive random access memory architecture as claimed in claim 6 further including a pair of control transistors each connected between the output terminal and a reference potential.

8. Magnetoresistive random access memory architecture as claimed in claim 6 further including a pair of series connected control transistors connected in parallel with the first series circuit.

9. Magnetoresistive random access memory architecture as claimed in claim 1 wherein the input terminal is coupled to the reference column by a pair of control transistors and the output terminal is coupled to a reference potential.

10. Magnetoresistive random access memory architecture as claimed in claim 1 further including a differential read-out circuit coupled to the data column and to the reference column for differentially comparing a data voltage generated from the data column to a reference voltage generated from the midpoint generator cell and providing a data output signal.

11. Magnetoresistive random access memory architecture as claimed in claim 10, wherein the differential read-out circuit includes a current conveyor and a differential amplifier.

12. Magnetoresistive random access memory architecture as claimed in claim 10 further including a plurality of data columns of memory cells positioned adjacent the reference column, the plurality of data columns being selectably connected, one at a time, to the differential read-out circuit for differentially comparing a data voltage generated from a selected data column of the plurality of data columns to the reference voltage generated from the midpoint generator.

13. Magnetoresistive random access memory architecture as claimed in claim 10 further including a plurality of data columns of memory cells and a plurality of reference columns each including a midpoint generator, the plurality of reference columns being interspersed with the plurality of data columns.

14. Magnetoresistive random access memory architecture as claimed in claim 13 wherein the plurality of data columns are divided into data blocks, each data block including a portion of the plurality of data columns, and the plurality of reference columns are embedded one each in each of the data blocks, the portion of the plurality of data columns and the embedded reference column in an associated block being connected to provide data voltages and a reference voltage, respectively, to the differential read-out circuit.

15. Magnetoresistive random access memory architecture as claimed in claim 13 wherein the plurality of data columns are divided into data blocks, each data block including a portion of the plurality of data columns, and the plurality of reference columns are disposed one each between adjacent data blocks, the adjacent data blocks and the interspersed reference column between the adjacent data blocks being connected to provide data voltages and a reference voltage, respectively, to the differential read-out circuit.

16. Magnetoresistive random access memory architecture as claimed in claim 13 wherein the memory cells of the plurality of data columns are arranged in a series-parallel architecture.

17. Magnetoresistive random access memory architecture as claimed in claim 13 wherein the memory cells of the plurality of data columns are arranged in a parallel-parallel architecture.

18. Magnetoresistive random access memory architecture as claimed in claim 17 wherein each column of the plurality of data columns includes a global bitline and a local bitline coupled to the global bitline by a segment select transistor.

19. Magnetoresistive random access memory architecture as claimed in claim 17 wherein each column of the plurality of data columns includes a global bitline and a local bitline including a plurality of memory cells each memory cell including a magnetic tunnel junction and a control transistor connected in series, the control transistor of each memory cell being connected directly to the global bitline.

20. Magnetoresistive random access memory architecture comprising:
   a substrate;
   at least one data column of memory cells positioned on the substrate and connected to have information stored therein, each memory cell including at least one non-volatile magnetoresistive element programmable to one of a data-Rmax and a data-Rmin state;
   at least one reference column including at least one midpoint generator positioned on the substrate adjacent the data column, the midpoint generator including a first terminal coupled to the reference column and a second terminal, a first series circuit including a first magnetoresistive element with a resistance equal to reference-Rmax connected in series with a first magnetoresistive element with a resistance equal to reference-Rmin, the first series circuit connected in series between the first terminal and the second terminal, and a second series circuit including a second magnotoresistive element with a resistance equal to reference-Rmax connected in series with a second magnetoresistive element with a resistance equal to reference-Rmin, the second series circuit connected in series between the first terminal and the second terminal and in parallel with the first series circuit, whereby a total resistance between the first terminal and the second terminal is a midpoint between reference-Rmax and reference-Rmin; and
   a differential read-out circuit coupled to the data column and to the reference column for differentially comparing a data voltage generated from the data column to a reference voltage generated from the midpoint generator cell and providing a data output signal.

21. Magnetoresistive random access memory architecture as claimed in claim 20 wherein each memory cell of the data column of memory cells includes a magnetic tunnel junction and a control transistor.

22. Magnetoresistive random access memory architecture as claimed in claim 21 wherein each memory cell includes a magnetic tunnel junction and a control transistor connected in series.

23. Magnetoresistive random access memory architecture as claimed in claim 21 wherein each memory cell includes a magnetic tunnel junction and a control transistor connected in parallel.

24. Magnetoresistive random access memory architecture as claimed in claim 20 wherein the data column includes a plurality of pairs of memory cells and the reference column includes a midpoint generator operatively and physically associated with each pair of memory cells.

25. Magnetoresistive random access memory architecture as claimed in claim 20 further including a plurality of data columns of memory cells positioned on the substrate adjacent the reference column, the plurality of data columns being selectably connected, one at a time, to the current conveyor for differentially comparing a data voltage generated from a selected data column of the plurality of data columns to the reference voltage generated from the midpoint generator.

26. Magnetoresistive random access memory architecture as claimed in claim 20 further including a plurality of data columns of memory cells and a plurality of reference columns each including a midpoint generator, the plurality of reference columns being interspersed on the substrate with the plurality of data columns.

27. Magnetoresistive random access memory architecture as claimed in claim 20 further including a plurality of data columns of memory cells and a plurality of reference columns each including a midpoint generator interspersed on the substrate with the plurality of data columns, the magnetoresistive elements of the plurality of data columns and the magnetoresistive elements of the plurality of reference columns being similar and being positioned on the substrate in a regular pattern.

28. Magnetoresistive random access memory architecture comprising:
   a plurality of data columns of memory cells connected to have information stored therein, each memory cell including a magnetoresistive tunnel junction element programmable to one of a data-Rmax and a data-Rmin state, the plurality of data columns being divided into data blocks, each data block including a portion of the plurality of data columns;
   a plurality of reference columns each including a plurality of midpoint generator cells, each midpoint generator cell including a first terminal coupled to an associated reference column and a second terminal, a first series circuit including a first magnetoresistive element with a resistance equal to reference-Rmax connected in series with a first magnetoresistive element with a resistance equal to reference-Rmin, the first series circuit connected in series between the first terminal and the second terminal, and a second series circuit including a second magnetoresistive element with a resistance equal to reference-Rmax connected in series with a second magnetoresistive element with a resistance equal to reference-Rmin, the second series circuit connected in series between the first terminal and the second terminal and in parallel with the first series circuit, whereby a total resistance between the first terminal and the second terminal is a midpoint between reference-Rmax and reference-Rmin;

the plurality of reference columns being interspersed with the plurality of data columns in one of an architecture in which the reference columns are disposed one each between adjacent data blocks and an architecture in which the reference columns are embedded one each in each data block; and a differential read-out circuit coupled to the plurality of data columns and to the plurality of reference columns for differentially comparing a data voltage generated from a data cell in a selected data column to a reference voltage generated from a midpoint generator cell in a reference column adjacent the selected data column of the plurality of reference columns and providing a data output signal.

* * * * *

UNITED STATES PATENT AND TRADEMARK OFFICE
CERTIFICATE OF CORRECTION

PATENT NO.     : 6,445,612 B1                                              Page 1 of 1
DATED          : June 5, 2003
INVENTOR(S)    : Naji It is certified that error appears in the above-identified patent and that said Letters Patent is hereby corrected as shown below:

<u>Column 10,</u>
Line 36, delete "claim 1" and add -- claim 6 --.

Signed and Sealed this

Twelfth Day of August, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,445,612 B1
DATED : September 3, 2003
INVENTOR(S) : Naji

It is certified that error appears in the above-identified patent and that said Letters Patent is hereby corrected as shown below:

Column 1,
Line 3, after the Title, please add as a new first paragraph the following paragraph:
-- This invention was made with Government support under Agreement No. MDA972-96-3-0016 awarded by DARPA. The Government has certain rights in the invention. --

Signed and Sealed this

Seventh Day of October, 2003

JAMES E. ROGAN
*Director of the United States Patent and Trademark Office*